United States Patent [19]

Hayashi

[11] Patent Number: 5,764,045
[45] Date of Patent: Jun. 9, 1998

[54] FREQUENCY MEASURING APPARATUS

[75] Inventor: Mishio Hayashi, Nerima-ku, Japan

[73] Assignee: Advantest Corporation, Tokyo, Japan

[21] Appl. No.: 705,154

[22] Filed: Aug. 29, 1996

[30] Foreign Application Priority Data

Sep. 8, 1995 [JP] Japan .................... 7-231729

[51] Int. Cl.$^6$ .................................................. G01R 23/02
[52] U.S. Cl. ...................... 324/76.48; 324/76.64; 377/44; 377/20
[58] Field of Search ................ 377/20, 44; 324/76.48, 324/76.47, 76.62, 76.63, 76.64

[56] References Cited

U.S. PATENT DOCUMENTS

| Re. 32,845 | 1/1989 | Hayashi . | |
|---|---|---|---|
| 4,112,358 | 9/1978 | Ashida | 324/76.62 |
| 4,953,095 | 8/1990 | Ishikawa | 377/20 |
| 5,095,264 | 3/1992 | Hulsing | 324/76.62 |
| 5,128,607 | 7/1992 | Clark | 324/76.47 |

Primary Examiner—Ernest F. Karlsen
Assistant Examiner—Jose M. Solis
Attorney, Agent, or Firm—Kanesaka & Takeuchi

[57] ABSTRACT

A fractional time frequency measuring apparatus includes a divider for dividing a frequency of a signal to be measured with a predetermined division factor; a counter unit for counting the divided signal with a standard clock for every period of the divided signal and outputting count results; a fractional time measuring unit for measuring fractional times produced by the counting with the standard clock; a sequence control unit to form a sequence circuit for sequentially counting the divided signal with the standard clock; a memory unit for holding the count results from the counter unit; a microprocessor for determining a value of the divisional factor, generating a reset signal, and calculating the frequency of the signal to be measured from the count results stored in the memory unit. The sequence control unit counts a predetermined number of pulses of the standard clock while it generates a write signal of count results in the memory unit, a reset signal for the counter unit, and an address signal for the memory unit; and the counter unit is preset at a value equal to the predetermined number of pulses.

3 Claims, 7 Drawing Sheets

| ADDRESS | RAM1 | RAM2 |
|---|---|---|
| 0 | x | x |
| 1 | $n_1$ | $\Delta t_1$ |
| 2 | $n_2$ | $\Delta t_2$ |
| 3 | $n_3$ | $\Delta t_3$ |
| 4 | $n_4$ | $\Delta t_4$ |
| 5 | $n_5$ | $\Delta t_5$ |
| 6 | $n_6$ | $\Delta t_6$ |
| ⋮ | ⋮ | ⋮ |
| n | $n_n$ | $\Delta t_n$ |
| ⋮ | ⋮ | ⋮ |

FIG.7

FREQUENCY MEASURING APPARATUS

BACKGROUND OF THE INVENTION

1. Field of the Invention

The present invention relates to frequency measuring apparatus for measuring the frequency or period of repeated signals in a short period of time with high resolution.

2. Description of the Related Art

FIG. 1 is a timing chart for explaining a measuring principle of a conventional frequency measuring apparatus.

In FIG. 1, a signal whose frequency is to be measured is inputted to the frequency measuring apparatus to provide pulses which are divided in a divider by a division factor N. If the period of the signal to be measured is P, the period of the divided signal is NP.

The divided signal is picked up in units of a predetermined gate time, and the period NP is counted by a high standard clock (normally 10 MHz) to calculate the frequency (see U.S. Pat. No. Re. 32.845).

Consequently, the error of the frequency measurement depends mainly on the long/short period stability of an oscillator in the standard clock so that a very stable quartz oscillator or the like is incorporated.

However, the measuring time of such a conventional frequency measuring apparatus is too long to make measurement where the frequency-measurement in a short period of time with high resolution is required for such a case as quartz oscillators are trimmed.

For example, if the resolution of eight digits in a gate time of 1 ms is required, it is necessary to make count with a pulse of 10 psec during the period NP shown in FIG. 1. In order to realize this resolution, it is necessary to employ high technologies such as control of the jitter of a signal, making the apparatus expensive. Thus, in order to provide an economical apparatus, it is desired to reduce the speed of counting pulse to 100 psec and combine the count with an mean measurement technique. The mean measurement technique is a technique for increasing the resolution by repeating the measurement for several times to find the mean value. The resolution is increased in proportion to the square root of the number of measurements. For example, if 100 measurements are taken, the resolution is increased by a digit by finding the mean value.

As shown in FIG. 1, the conventional frequency apparatus alternates counting the divided signal with the standard clock and calculating the frequency in every other periods so that if 100 measurements are taken by the mean measurement technique, the measuring time is 100×2NP=200 NP (if NP=1 ms, the measuring time is as long as approximately 200 ms).

SUMMARY OF THE INVENTION

Accordingly, it is an object of the invention to provide a frequency measuring apparatus which is inexpensive and capable of measuring frequencies in a short period of time with high resolution.

According to the invention there is provided a frequency measuring apparatus including a divider for dividing a frequency of a signal to be measured with a predetermined division factor; a counter unit for counting the divided signal with a standard clock for every period of the divided signal and outputting count results; a fractional time measuring unit for measuring fractional times produced by the counting with the standard clock; a sequence control unit to form a sequence circuit for sequentially counting the divided signal with the standard clock; a memory unit for holding the count results from the counter unit; a microprocessor for determining a value of the divisional factor, generating a reset signal, and calculating the frequency of the signal to be measured from the count results stored in the memory unit, characterized in that the sequence control unit counts a predetermined number of pulses of the standard clock while it generates a write signal of count results in the memory unit, a reset signal for the counter unit, and an address signal for the memory unit; and the counter unit is preset at a value equal to the predetermined number of pulses.

The fractional time measuring unit includes an integrator for switching a plurality of integrations to output sloped voltages set at a predetermined ratio and executing a selected integration, and a plurality of gate circuits for passing pluses of the standard clock for respective integration times of the integrations; the counter unit comprises a plurality of counters connected according to the ratio; and the counters count respective pulses of the standard clock from the gate circuits.

Thus constructed frequency measuring apparatus generates a write signal of count results in the memory unit, a reset signal for the counter unit, and an address signal for the memory unit while the sequence control unit counts a predetermined number of pulses of the standard clock. Presetting the counter unit at a value equal to the predetermined number of pulses produces results equivalent to those of uninterrupted counting. Consequently, it is unnecessary to alternate measurement and process of the frequency of the signal to be measured as in the conventional system, thereby preventing loss of the measuring time.

The integrator of the fractional time measuring unit performs a plurality of integrations at a predetermined ratio, and a plurality of gate circuits pass a pulse of the standard clock for each integration time of the integrations. A plurality of counter units connected according to the predetermined ratio count respective numbers of the standard clock pulse to expand the fractional time for increasing the resolution of counting with the standard clock.

When measurement data relative to a great number of gate times is obtained in the mean technique, it is common practice to repeat the same measurements in units of 1 NP (=1 msec) for the necessary times as shown in FIG. 2(a). However, according to the invention there is employed a method for shifting by 1 MP (8–16 μsec) to thereby improve the measuring time (1/111-1/77 for a gate time of 1 msec, 1/200 for a gate time of 1 sec). As 1 MP is made as small as possible (that is, as small the division factor M as possible), it is more advantages, but the operation time of the fractional time measuring unit put a limit thereon. According to the invention, it is expected to be 6.5 μsec.

BRIEF DESCRIPTION OF THE DRAWINGS

FIG. 7 is a diagram showing the contents of data stored in the memory unit for the apparatus of FIG. 3.

DESCRIPTION OF THE PREFERRED EMBODIMENT

Figure 1:
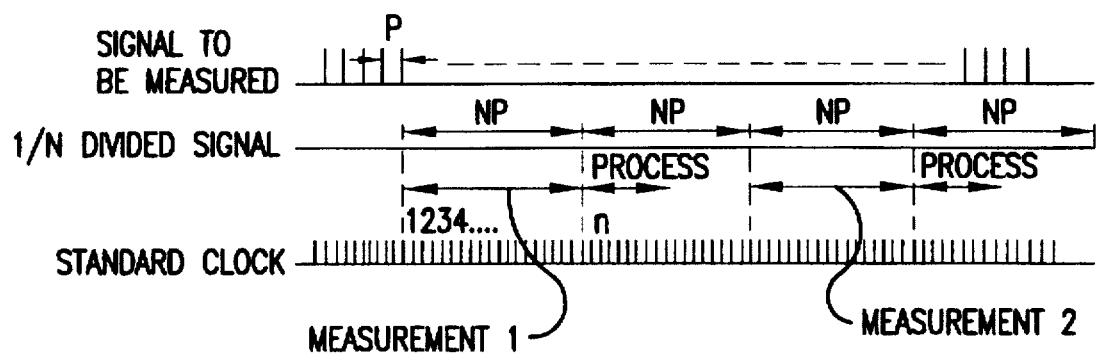
FIG. 1 is a timing chart for explaining the measuring principle of a conventional frequency measuring apparatus.
Figure 2A:
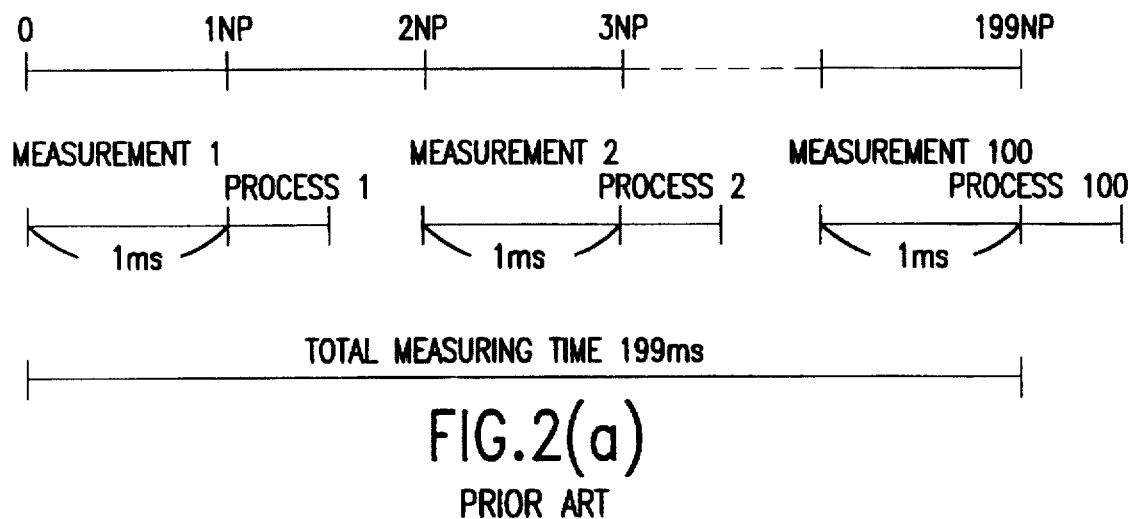
FIGS. 2(a) and 2(b) are timing charts for making comparison in measuring principle between the conventional frequency measuring apparatus and the present invention.
Figure 2B:
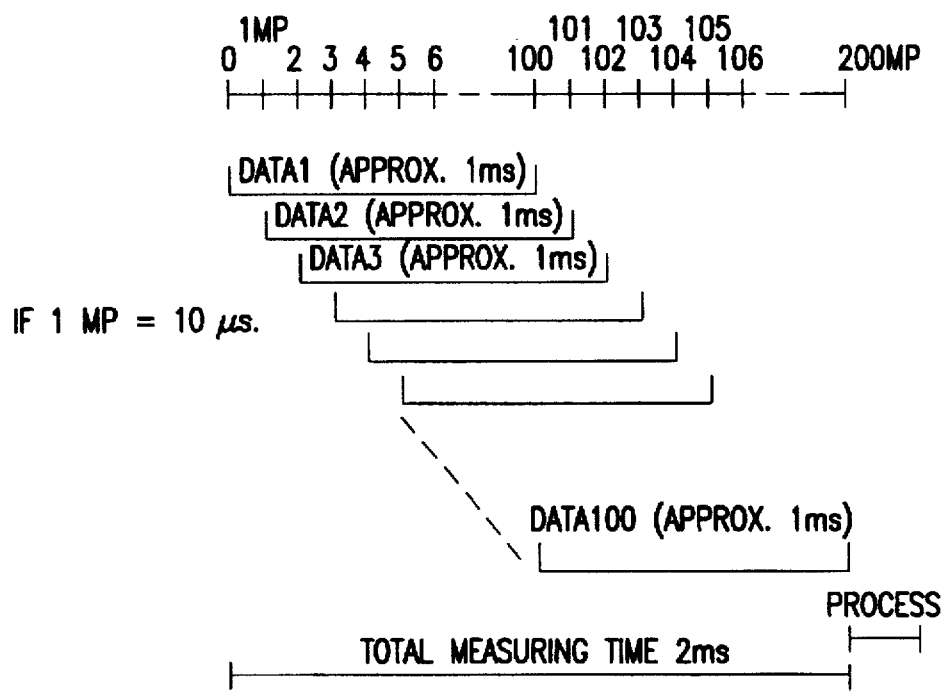
Figure 3:
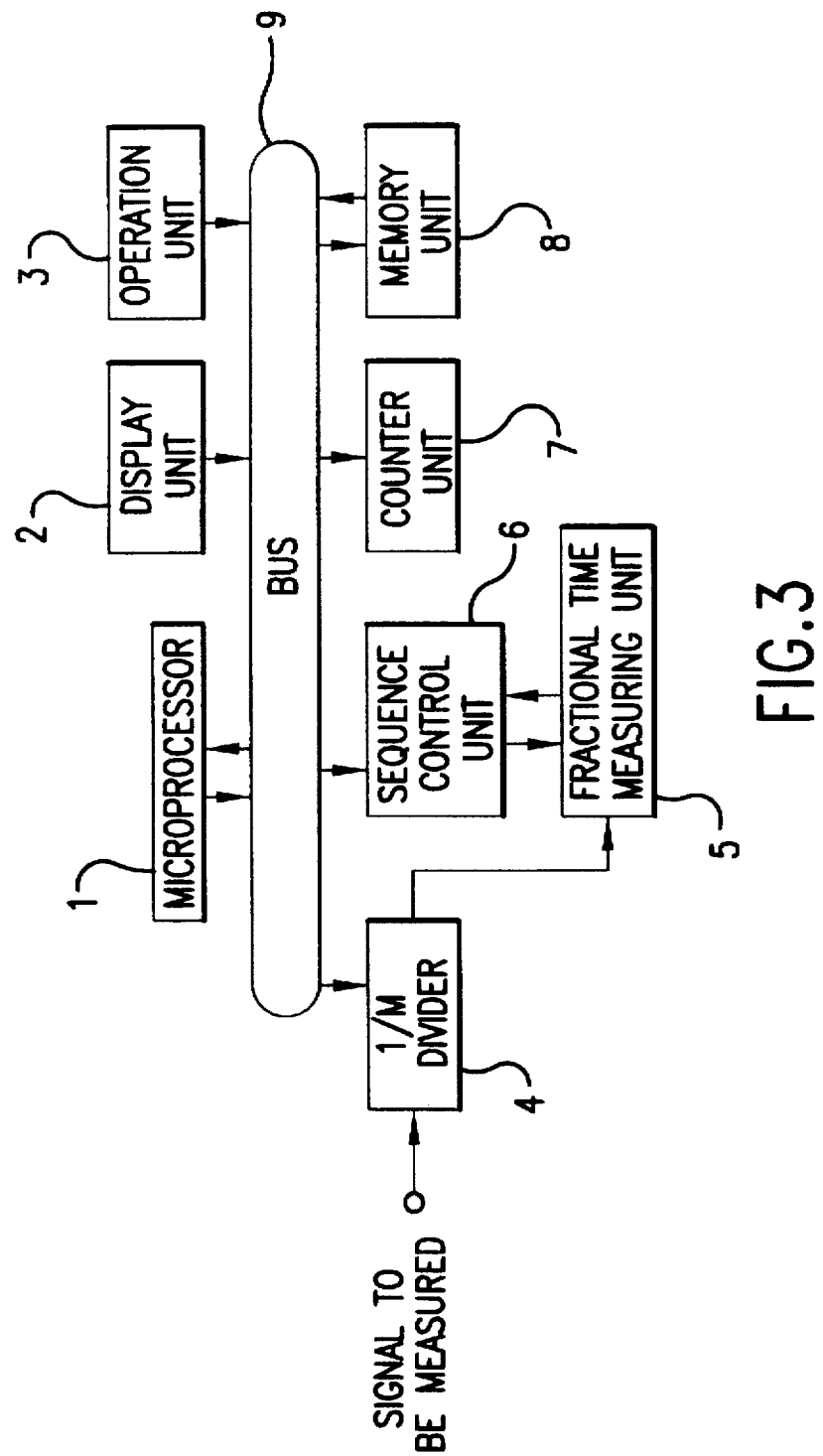
FIG. 3 is a block diagram of a frequency measuring apparatus according to an embodiment of the invention.

In FIG. 3, the frequency measuring apparatus according to the invention includes an operation unit 3 for setting a gate time (for example, selected from 1 msec, 10 msec, 0.1 sec, and 1 sec) and inputting an approximate frequency of the signal to be measured (approximately three digits of a significant figure); a display unit 2 for displaying the measured frequency of the signal; a 1/M divider 4 for dividing the signal by a division factor M which is determined according to the approximate frequency inputted by the operation unit 3; a fractional time measuring unit 5 for measuring the fractional time which is produced when the divided signal is counted with a standard clock; a sequence control unit 6 for forming a sequence circuit for sequentially counting the divided signal with the standard clock; a counter unit 7 for counting the divided signal with the standard clock; a memory unit 8 for holding the count results from the counter unit 7; and a microprocessor 1 for executing a control program to determine the division factor M, issue a RESET signal, and calculate the mean value of counted frequencies. The microprocessor 1, the display unit 2, the operation unit 3, the 1/M divider 4, the fractional time measuring unit 5, the sequence control unit 6, the counter unit 7, and the memory unit 8 are connected to each other by a common bus 9 for data transfer.

The 1/M divider 4 is made up of binary counters, and the value of the division factor M is set by the exponent of 2. The division factor M is determined by the microprocessor 1 according to the value of an approximate frequency inputted by the operation unit 3 in such that the period of an output signal from the 1/M divider 4 is 8–16 is for example. Some examples are shown in the following table.

| APPROX. FREQUENCY | DIVISION NUMBER | OUTPUT PERIOD |
|---|---|---|
| 1.23 MHz | 1/16 | 13 μs |
| 23.4 MHz | 1/256 | 10.9 μs |
| 128 MHz | 1/2048 | 16 μs |

Figure 4:
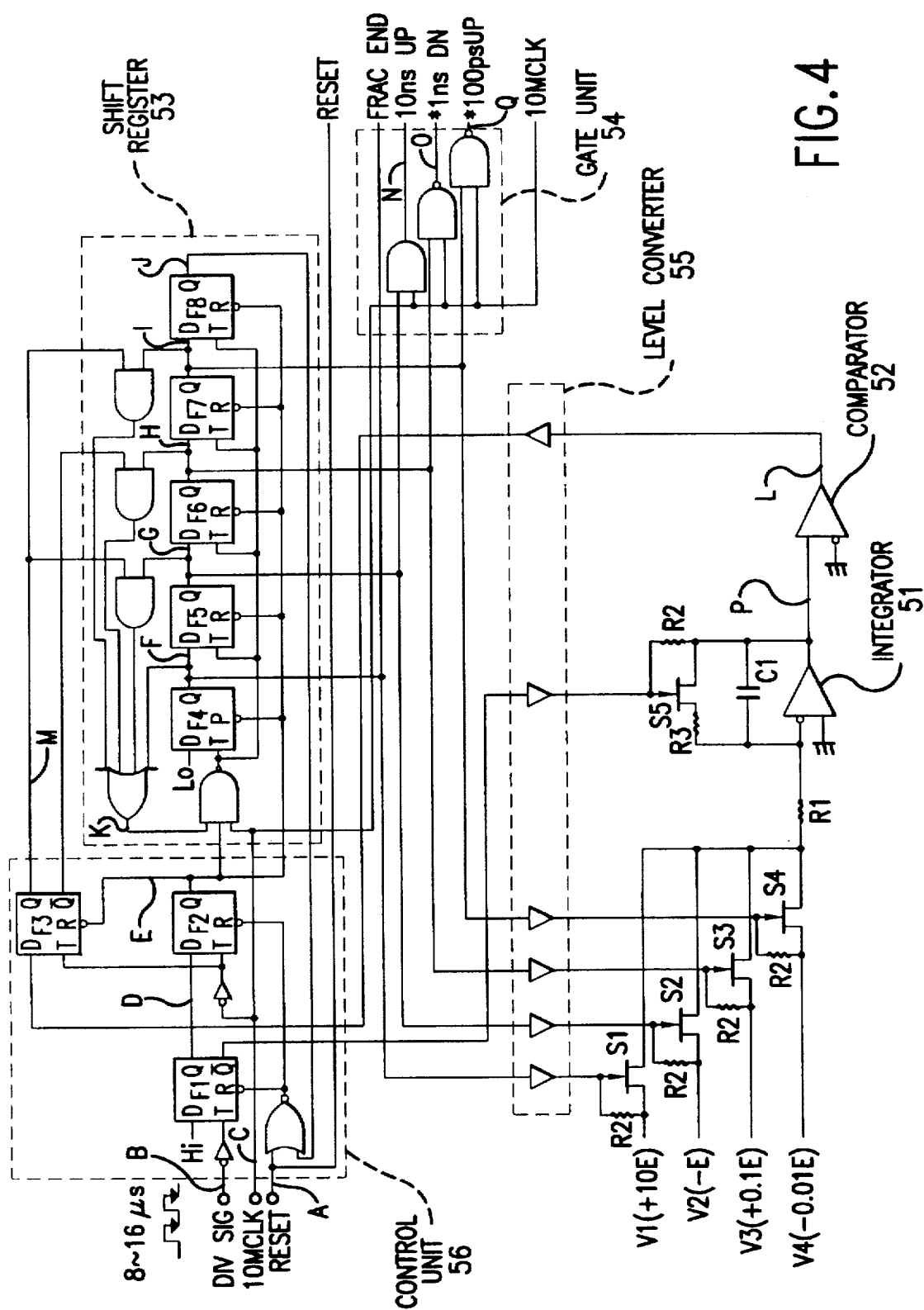
FIG. 4 is a circuit diagram of a fractional time measuring unit for the apparatus of FIG. 3.

In FIG. 4, the fractional time measuring unit 5 includes an integrator 51 to which one of four voltages V1=+10E, V2=-E, V3=+0.1E, and V4=-0.01E (where E is a given DC voltage) is applied via one of four switches S1–S4; a comparator 52 for comparing the output voltage of the integrator 51 with 0V to output a comparison result; a shift register 53 consisting of five flip-flops and outputting ON/OFF timing signals to the switches S1–S4; a gate unit 54 for outputting a standard pulse of 10 MCLK while the integrator 51 integrates one of the input voltages V1–V4; and a level converter 55 for matching signal levels between the analog circuits, such as the integrator 51 he comparator 52, and the digital circuits, such as the shift register 53 and the gate unit 54. A control unit 56 is connected to the shift register 53 for controlling the operation and turning a switch 5 on/off. With this configuration, it is possible to form a multislope system capable of switching four types of power sources, and the fractional time measuring unit 5 is able to expand the fractional time by 1000 times for measurement.

Figure 5:
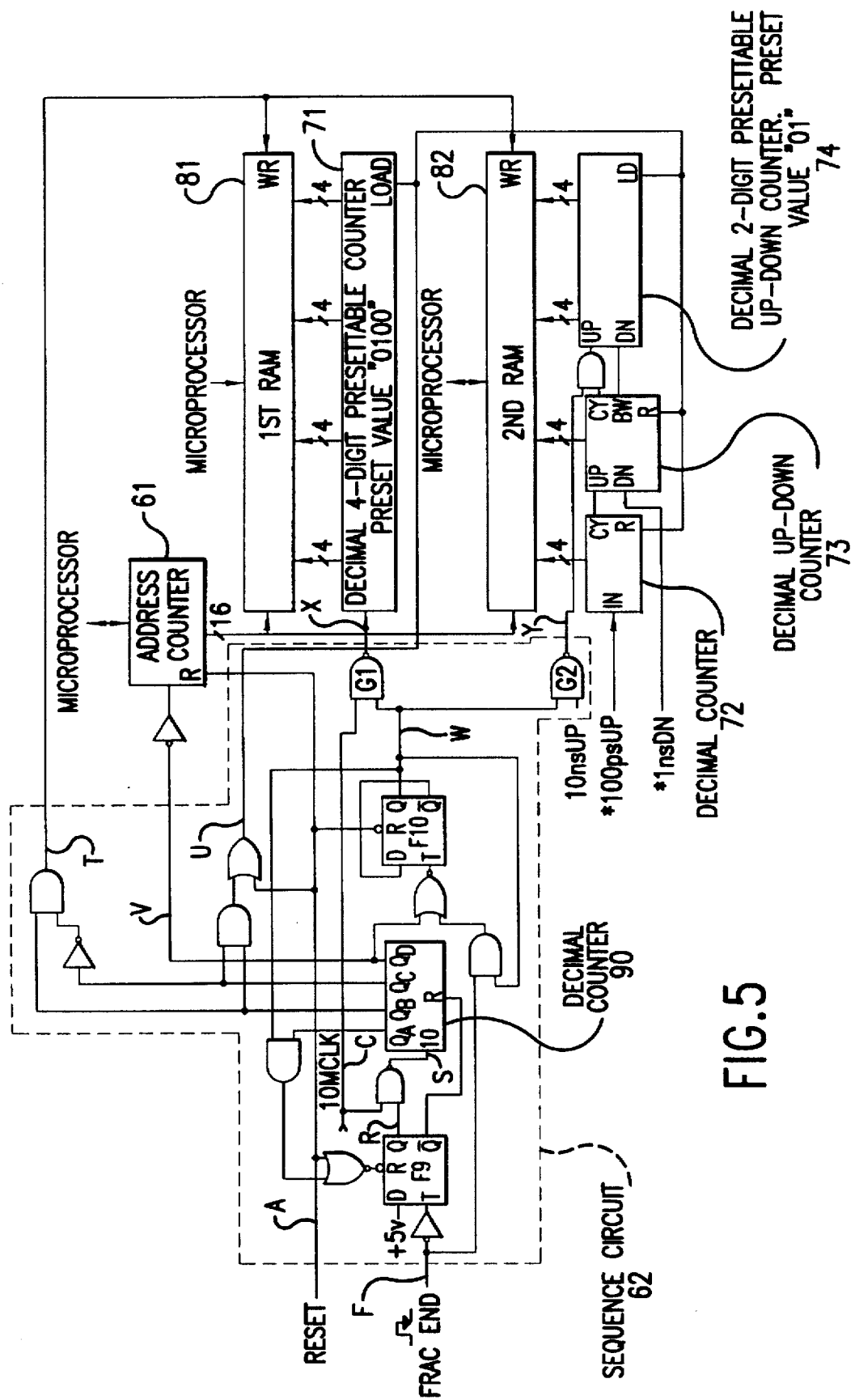
FIG. 5 is a circuit diagram of sequence control, counter, and memory units for the apparatus of FIG. 3.

In FIG. 5, the counter unit 7 consists of a decimal 4-digit presettable counter 71 for counting the number of pulses of standard 10 MCLK during a period of the divided signal to be measured; a decimal counter 72 for counting the number of pulses of standard 10 MCLK while the integrator 51 integrates the inputted voltage V4 (the fourth integration hereinafter described); a decimal up-down counter 73 for counting the number of pulses of standard 10 MCLK while the integrator 51 integrates the inputted voltage V3 (the third integration hereinafter described); and a decimal 2-digit presettable up-down counter 74 for counting the number of pulses of standard 10MCLK while the integrator 51 integrates the inputted voltage V2 (the second integration hereinafter described).

The memory unit 8 consists of a first RAM 81 for storing the count results from the decimal 4-digit presettable counter 71 and a second RAM 82 for storing the count results from the decimal counter 72, the decimal up-down counter 73, and the decimal 2-digit presettable up-down counter 74.

The sequence control unit 6 consists of an address counter 61 to generate write addresses in the first RAM 81 and the second RAM 82 and a sequence circuit 62 to generate a clock for the address counter 61, write pulses WR to the first RAM 81 and the second RAM 82, and reset signals for the respective counters of the counter unit 7.

The operation of the fractional time measuring unit 5, the sequence control unit 6, the counter unit 7, and the memory unit 8 will be described below with reference to FIGS. 4–6. A–Y in the parentheses represents respective characters in FIG. 6 wherein the signal waveforms (O), (Q), and (Y) are shown in the inverted polarity for convenience. These characters are also assigned to the corresponding positions in FIGS. 4 and 5.

When the microprocessor 1 outputs a RESET signal (A), the flip-flops F1–F10 of the fractional time measuring unit 5 and the sequence control unit 6 (FIGS. 4–5) are initialized. The shift register 53 made up of the flip-flops F4–F8 is set at 10000 while the remainder is reset (DJ, R, and W in FIG. 6).

Then, when the divided signal DIV SIG (B) divided by the 1/M divider 4 is inputted to the fractional time measuring unit 5, the output signal (D) from the flip-flop F1 of the control unit 56 is inverted in synchronism with the fall of the DIV SIG (B) so that the switch S5 of the integrator 51 is turned off, making the integrator 51 start integration. At this point, the switch S1 is on by the initialization of the shift register 53 so that the voltage V1 (+10E) is inputted to the integrator 51.

In the initial state (the switch S5 on) of the integrator 51 prior to input of the DIV SIG (B), the output voltage from the integrator 51 is fed back to the input via a resistor R3 to output a voltage of (R3/R1)10E. The value of the resistor R3 is set to be R1>>R3 so that the output voltage from the integrator 51 is very low. This value produces offset errors to fractional time measurements but, since the microprocessor 1 calculates a fractional time from a difference between two measurements, the offset errors are offset.

When the integrator 51 starts integration, first of all, the first integration of the voltage V1 (+10E) is executed. As described above, the first integration starts from the fall of the DIV SIG (B) and ends at a time when the output signal (F) from the flip-flop F4 of the shift register 53 is inverted, that is, two pulses of standard clock 10 MCLK (C) are counted ($\Delta t_1$, $\Delta t_2$ in FIG. 6). The voltage from the integrator 51 at this point takes a waveform shown by P in FIG. 6.

Then, when the output signal FRAC END (F) from the flip-flop F4 turns off the switch S1 while the output signal (G) from the flip-flop F5 of the shift register 53 turns on the switch S2, the voltage V2 (−E) is inputted to the integrator 51 to perform the second integration. This second integration generates an output voltage having a polarity opposite to that of the first integration and a slope of 1/100 that of the first integration. It ends at a time when two pulses of standard clock 10 MCLK (C) are counted after the output voltage (P) from the integrator 51 intersects 0V (Tk in FIG. 6).

When the second integration ends, the output signal (G) of the flip-flop F5 turns off the switch S2, and the output signal (H) from the flip-flop F6 of the shift register 53 turns on the switch S3, the voltage V3 (0.1E) is inputted to the integrator 51 to execute the third integration. The integrator 51 outputs a voltage having a polarity identical with and a slope of 1/100 that of the first integration. Also, it ends at a time when two pulses of standard 10 MCLK are counted after the output voltage (P) from the integrator 51 intersects 0V (Tl in FIG. 6).

When the third integration ends, the output signal (H) from the flip-flop F6 turns off the switch S3 and the output signal (I) from the flip-flop F7 of the shift register 53 turns on the switch S4, the voltage V4 (−0.01E) is inputted to the integrator 51 to perform the fourth integration. The output voltage from the integrator 51 has a polarity identical with that of the second integration and a slope of 1/1000 that of the first integration. The fourth integration ends when the output voltage (P) from the integrator 51 intersects 0 V (Tm in FIG. 6), when the fractional time measurement also ends.

If $\Delta t_n$ is the first integration time, To the period of standard clock 10 MCLK, and $k_n$, $I_n$, and $m_n$ (n=1, 2, 3 . . . ) each the number of pulses of standard clock 10 MCLK passing the gate unit 54 during the second, third, or fourth integration time, then $$\Delta t_n = To(K_n/10 = 1_n/100 + m_n/1000) \quad (1)$$

The expression (1) is modified as follows $$\Delta t_n = To/1000(100k_n - 10 1_n + m_n) \quad (1)'$$

The expression (1) is derived from the connection of the respective counters (the decimal counter 72, the decimal up-down counter 73, and the decimal 2-digit presettable up-down counter 74) of the counter unit 7 as shown in FIG. 5. This shows the possibility of measurement with a resolution of 1/1000 the period To of the standard clock 10 MCLK. Thus, it is possible to make an inexpensive high resolution frequency measuring apparatus.

Then, when the FRAC END signal (F) falls, the output (R) from the flip-flop P9 of the sequence circuit 62 is inverted to release the reset of the decimal counter in the sequence circuit 62 to start counting from the next inputted pulse of standard clock 10 MCLK (C).

The counting output from the decimal counter of the sequence circuit 62 is subjected to a logical process to output in sequence a WR pulse (T), a counter reset pulse (U), and an address pulse (V) for advancing count of the address counter 61. When the WR pulse is outputted, the counting results of the respective counters of the counter unit 7 are written in the first RAM 81 and the second RAM 82, and the respective counters of the counter unit 7 are reset by the reset pulse. The address pulse sets the addresses of the first RAM 81 and the second RAM 82 at which the next counting result is stored. This process ends before 10 pulses of standard clock 10 MCLK are counted.

When the decimal counter of the sequence circuit 62 counts 10 pluses of standard clock 10 MCLK, the gates of NAMD gates G1 and G2 are opened so that the decimal 4-digit presettable counter 71 and decimal 2-digit presettable up-down counter 74 of the counter unit 7 start counting from the 11th pulse. These counters are preset at a count value of 10.

Since the count value is preset at 10, the decimal 4-digit presettable counter 71 and the decimal 2-digit presettable up-down counter 74 produce the count results which are equivalent to those as if they counted during the count interrupt period.

Figure 6:
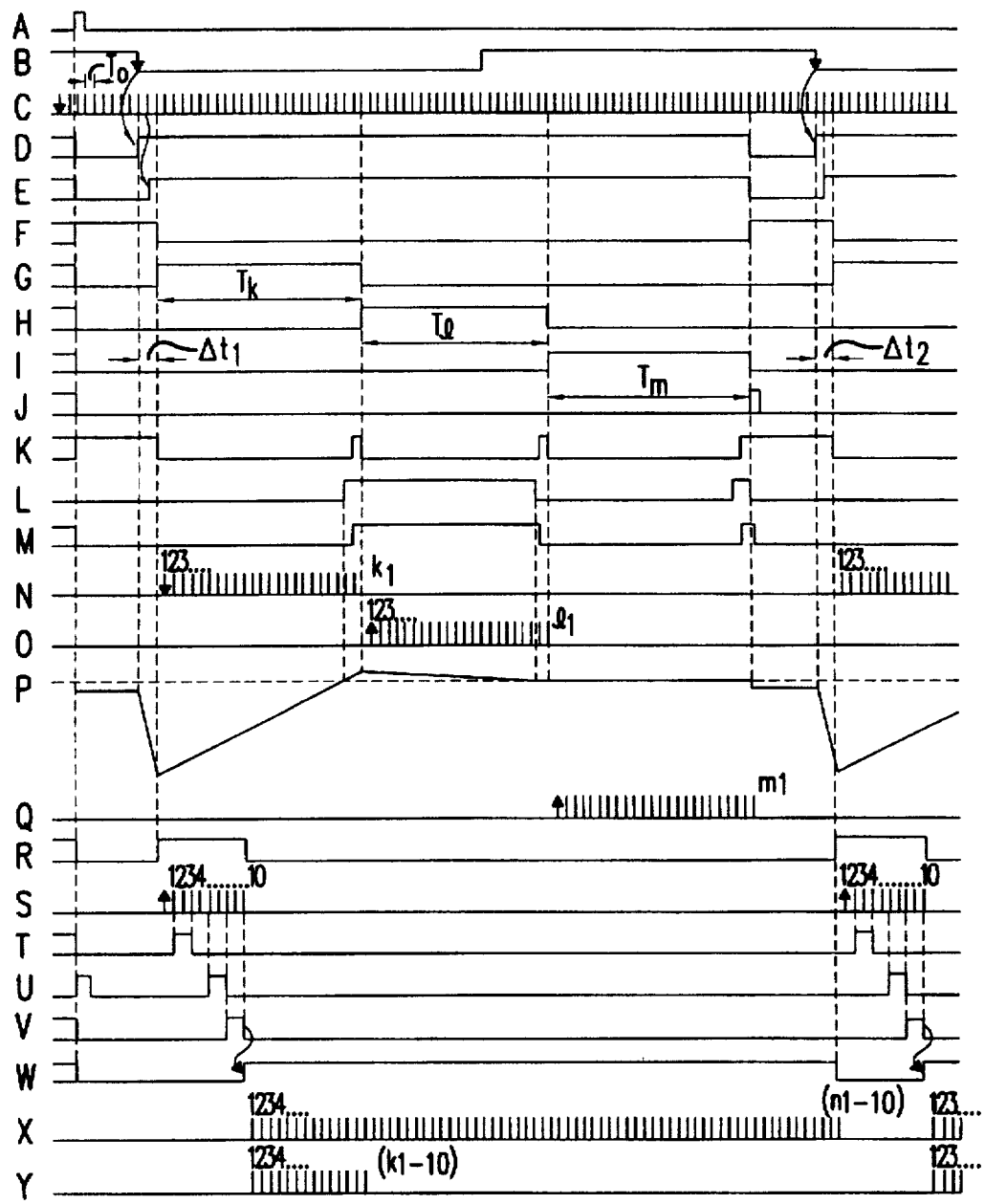
FIG. 6 is a timing chart for explaining the operation of the apparatus of FIG. 3.

The decimal 4-digit presettable counter 71 counts the number of pulses $n_n$ if standard clock 10 MCLK in a period between the fall of $\Delta t_n$ and the fall of $\Delta t_{n+1}$ (X in FIG. 6). The decimal 2-digit presettable up-down counter 74 counts the above $k_n$ (Y of FIG. 6) while the decimal up-down counter 73 down-counts In (O of FIG. 6) and the decimal counter 72 counts $m_n$ (Q of FIG. 6).

As shown in FIG. 5, the carrier out CY from the decimal counter 72 is inputted to the UP terminal of the decimal up-down counter 73 while the carrier out CY from the decimal up-down counter 73 is inputted to the UP terminal of the decimal 2 -digit presettable up-down counter 74. Thus connected hardware executes the operation of the expression (1).

The operation of the microprocessor 1 will be described below.

When the gate times are set via the operation unit 3, the microprocessor 1 determines the measuring times relative to the set gate times as follows

| GATE TIME | MEASURING TIME | y |
|---|---|---|
| 1 ms | 1 ms + 1.6 ms | $10^2$ |
| 10 ms | 10 ms + 1.6 ms | $10^2$ |
| 0.1 s | 0.1 s + 0.016 s | $10^3$ |
| 1 s | 1 s + 0.16 s | $10^4$ | wherein y is the number of data for making mean and is arbitrarily determined. (For example, if the gate time is 1 ms, the maximum additional time for increasing the resolution by a digit is $16\mu s \times 10^2 = 1.6$ ms.) The measuring times are set by the software timer considering the periods (8–16μsec) of the divided signal to be measured.

After a single period of the divided signal DIV SIG is counted with the standard clock 10MCLK, such data as shown in FIG. 7 are stored in the first and second RAMs 81 and 82 of the memory unit 8. That is, FIG. 7 shows the contents of data stored in the memory unit shown in FIG. 3. Based on the data, the microprocessor 1 executes the following operation at the end of the measuring time.

First of all, the count value $Q=(T_G \times f_p)/M$ is determined from the approximate frequency $f_p$ of the inputted signal to be measured, the division factor M, and the gate time $T_G$. The count value Q indicates the number of pulses of the divided signal DIV SIG present in the gate time $T_G$.

From the contents of the first and second RAMs 81 and 82, the periods of the signal to be measured are determined as follows (for y, see the foregoing)

$$P_1 = 1/M(T_0 (n_1 + n_2 + \ldots + n_Q) + \Delta t_1 - \Delta t_Q) \quad (2)$$

$$P_2 = 1/M(T_0 (n_2 + n_3 + \ldots + n_{Q+1}) + \Delta t_2 - \Delta t_{Q+1})$$

$$\vdots$$

$$P_y = 1/M(T_0 (n_y + n_{y+1} + \ldots + n_{Q+y-1}) + \Delta t_y - \Delta t_{Q+y-1})$$

wherein $n_Q$ is the number of pulses of 10 MCLK standard clock for the Q-th period of the divided signal. Similarly, $n_{Q+y}-1$ is the number of pluses of 10 MCLK standard clock for the $(Q+_{y-1})$th period of the divided signal.

From $P_1$–$P_y$ of the expression (2), the mean period $P_{mean}$ of the signal to be measured is determined as follows:

$$P_{mean}=1/y\ (P_1+\ldots+P_y) \qquad (3)$$

Thus, the frequency $f_{mean}$ (mean value) of the signal to be measured is $$f_{mean}=1/P_{mean} \qquad (4)$$

Accordingly, if the gate time is set at 1 msec, the measuring time is 2.6 msec so that when the standard clock is 10 MH$_z$, the resolution is equal to 1/1000×0.1 µs (10MH$_z$) or 100 psec. Thus, $$(1\ msec/100\ psec) \times y^{1/2}=10^7 \times 100^{1/2}=10^8$$

the eight digit measuring result is obtained. Thus, it is possible to provide high-speed frequency measurement even if the operation time of the microprocessor and the transfer time of data are considered.

If the gate time is set at 1 sec, the measuring time is 1.16 sec. Thus, $$(1\ sec/100\ psec) \times y^{1/2}=10^{10} \times (10^4)^{1/2}=10^{12}$$

the 12-digit measurement is obtained so that it is possible to provide high resolution frequency measurement without extending the measuring time.

In the above description, the frequency value of approximately three digits are given via the operation unit 3 but, since the apparatus according to the invention has two systems of counters for the main clock and the fractional times, it is possible to provide frequency measurement of three to four digits by adding such a circuit as to generate the gate time in the former and count the number of gated pulses of an inputted signal in the latter. Accordingly, by performing the above operation before measurement is made, it is possible to eliminate the inputting step via the operation unit 3.

The invention as constructed above produces the following effects:

It is unnecessary to alternate counting the standard clock of the signal to be measured and calculation of the frequency at every other periods as in the conventional, thus eliminating the measuring time loss, providing high speed frequency measurement even if the operation time of the microprocessor and the data transfer time are considered.

The resolution of the count by the standard clock is improved by means of equivalency so that it is possible to provide high resolution frequency measurement with an inexpensive apparatus.

A great number of data required to average obtained in each period so that it is possible to provide extremely high speed measurement (77 times or more faster than the conventional one).

What is claimed is:

1. A frequency measuring apparatus comprising:

a divider for dividing a frequency of a signal to be measured with a predetermined division factor;

a fractional time measuring unit including an integrator for switching and outputting a plurality of sloped voltages set at predetermined ratios, a plurality of gate circuits for passing a pulse of a standard clock for each integration time of said integrator, and a shift register for receiving said divided signal and outputting a timing signal for switching said sloped voltages;

a counter unit including a first counter for counting a predetermined number of pulses with said standard clock from a fall of said divided signal, a second counter for counting a period of said divided signal with pulses of said standard clock after counting by said first counter, and third, fourth, and fifth counters connected according to said ratios for counting pulses of said standard clock from said gate circuit after counting by said first counter;

a memory unit for holding count results of said second, third, fourth, and fifth counters;

a sequence control unit for writing said count results in said memory unit, resetting said counter unit, and addressing said memory unit; and a microprocessor for determining a divided frequency from an approximate frequency of said signal to be measured and calculating a frequency of said signal from said count results in said memory unit.

2. A frequency measuring apparatus according to claim 1, wherein said division factor of said divider is set at a minimum value;

said divided signal is measured in said counter unit in sequence without omission; and said sequence control unit employs a mean measuring technique with an algorithm by which data, which is equivalent to a gate time during which data about measurement results in said counter unit is taken in, is obtained by overlapping but shifting by a period of said signal to be measured.

3. A frequency measuring apparatus according to claim 1, wherein said division factor in said divider is set at a minimum value;

said divided signal is measured in said counter unit in sequence without omission;

said sequence control unit employs a mean measuring technique with an algorithm by which data, which is equivalent to a gate time during which data about measuring results from said counter unit is taken in, is obtained by overlapping but shifting by a period of said signal to be measured.

* * * * *